United States Patent
Yang et al.

(10) Patent No.: US 7,687,877 B2
(45) Date of Patent: Mar. 30, 2010

(54) INTERCONNECT STRUCTURE WITH A MUSHROOM-SHAPED OXIDE CAPPING LAYER AND METHOD FOR FABRICATING SAME

(75) Inventors: Chih-Chao Yang, Glenmont, NY (US); David V. Horak, Essex Junction, VT (US); Takeshi Nogami, Schenectady, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 12/115,944

(22) Filed: May 6, 2008

(65) Prior Publication Data

US 2009/0278258 A1 Nov. 12, 2009

(51) Int. Cl.
*H01L 23/485* (2006.01)
*H01L 21/768* (2006.01)

(52) U.S. Cl. .............. 257/508; 257/758; 257/E23.019; 257/E21.575; 438/404; 438/622

(58) Field of Classification Search ........... 257/508, 257/758, E23.019, E21.575; 438/404, 622
See application file for complete search history.

(56) References Cited

U.S. PATENT DOCUMENTS

| | | | |
|---|---|---|---|
| 5,117,276 A * | 5/1992 | Thomas et al. .............. 257/758 |
| 5,532,516 A * | 7/1996 | Pasch et al. .................. 257/752 |
| 5,960,316 A * | 9/1999 | Bai .............................. 438/633 |
| 6,150,257 A | 11/2000 | Yin et al. |
| 6,329,701 B1 * | 12/2001 | Ngo et al. .................... 257/622 |
| 6,838,370 B1 | 1/2005 | Niuya et al. |
| 7,052,932 B2 * | 5/2006 | Huang et al. ................. 438/105 |
| 7,279,414 B1 | 10/2007 | Yin et al. |
| 7,288,782 B1 | 10/2007 | Avanzino et al. |
| 7,491,658 B2 * | 2/2009 | Nguyen et al. ............... 438/789 |

(Continued)

OTHER PUBLICATIONS

Raghavan, G., et al., "Diffusion of Copper through Dielectric Films under Bias Temperature Stress," Thin Solid Films, 262 (1995) 262.

(Continued)

*Primary Examiner*—Victor A Mandala
(74) *Attorney, Agent, or Firm*—Scully, Scott, Murphy & Presser, P.C.; Katherine S. Brown, Esq.

(57) ABSTRACT

An interconnect structure is provided that includes a dielectric material 52' having a dielectric constant of 4.0 or less and including a plurality of conductive features 56 embedded therein. The dielectric material 52' has an upper surface 52r that is located beneath an upper surface of each of the plurality of conductive features 56. A first dielectric cap 58 is located on the upper surface of the dielectric material 52' and extends onto at least a portion of the upper surface of each of the plurality of conductive features 56. As shown, the first dielectric cap 58 forms an interface 59 with each of the plurality of conductive features 56 that is opposite to an electrical field that is generated by neighboring conductive features. The inventive structure also includes a second dielectric cap 60 located on an exposed portion of the upper surface of each of the plurality of conductive features 56 not covered with the first dielectric cap 58. The second dielectric cap 60 further covers on an exposed surface of the first dielectric cap 58.

7 Claims, 2 Drawing Sheets

U.S. PATENT DOCUMENTS

| | | | |
|---|---|---|---|
| 7,531,384 B2 * | 5/2009 | Yang et al. | 438/118 |
| 7,554,144 B2 * | 6/2009 | Lai et al. | 257/295 |
| 2004/0113279 A1 * | 6/2004 | Chen et al. | 257/774 |
| 2008/0122045 A1 * | 5/2008 | Yang et al. | 257/642 |
| 2008/0197500 A1 * | 8/2008 | Yang et al. | 257/758 |
| 2008/0290519 A1 * | 11/2008 | Yang et al. | 257/751 |
| 2009/0146244 A1 * | 6/2009 | Tischler | 257/506 |

OTHER PUBLICATIONS

Noguchi, J., et al., "Impact of Low-K Dielectrics and Barrier Metals on TDDB Lifetime of Cu interconnects," Proceedings of IRPS (2001) 355.

Noguchi, J., et al., "Cu-Ion-Migration Phenomena and its Influence on TDDB Lifetime in Cu Metallization," Proceedings of IRPS (2003) 287.

* cited by examiner

US 7,687,877 B2

INTERCONNECT STRUCTURE WITH A MUSHROOM-SHAPED OXIDE CAPPING LAYER AND METHOD FOR FABRICATING SAME

FIELD OF THE INVENTION

The present invention relates to a semiconductor structure, and a method of fabricating the same. More particularly, the present invention relates to a semiconductor interconnect structure having a high leakage resistance as well as substantially no metallic residues (e.g., defects) present at the upper surface of the interconnect dielectric. The present invention also provides a method in which the leakage resistance within an interconnect structure is improved, while substantially avoiding the presence of metallic residues (e.g., defects) at the upper surface of the interconnect dielectric.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, or a Cu alloy since Cu-based interconnects provide higher speed signal transmission between large numbers of transistors on a complex semiconductor chip as compared with aluminum, Al-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In current semiconductor interconnect structures, time-dependent-dielectric-breakdown (TDDB) has been identified as one of the major reliability concerns for future interconnect structures that include Cu-based metallurgy and low k dielectric materials. By "TDDB" it is meant that overtime the dielectric material of the interconnect structure begins to fail. The failure of the dielectric material may be caused by intrinsic means or by defects that are formed on the surface of the interconnect dielectric material during the course of preparing the interconnect structure.

Leakage of metallic ions, particularly Cu ions, along the interconnect dielectric surface has been identified as the major intrinsic failure mechanism that attributes to TDDB. FIG. 1 is a prior art interconnect structure 10 which illustrates this intrinsic leakage phenomenon. Specifically, the prior art interconnect structure includes a dielectric material 12 having a Cu feature 14 embedded therein. The Cu feature 14 is typically separated from the dielectric material 12 by a diffusion barrier 16. A dielectric capping layer 18 is present on the surface of the dielectric material 12, the diffusion barrier 16 and the Cu feature 14. In FIG. 1, arrows 20 designate the leakage (diffusion) of Cu ions from the conductive feature 14 which occurs along the upper surface of the interconnect structure as shown. Overtime this leakage of Cu ions results in TDDB as well as failure of the devices within the interconnect structure. In addition to arrows 20, FIG. 1 also includes curved arrows 21 which represent the direction of the electrical field that is generated between neighboring conductive features embedded within the dielectric material of the interconnect structure.

Another contributor to TDDB, which is also illustrated in FIG. 1, is defect related. Specifically, Cu residues (e.g., defects) 22 are present at the interface between the upper surface of the dielectric material 12 and the dielectric capping layer 18. The Cu residues 22 are formed during the formation of the Cu features 14 (i.e., deposition and planarization of Cu within an opening formed into the dielectric material 12). Post planarization Cu residues, which provide defects at the surface of the dielectric material, are one of the root causes of time-dependent-dielectric-breakdown (TDDB) failure.

It is observed that although Cu is specifically mentioned with respect to the prior art interconnect structures mentioned above, the above leakage and defect problems occur (although at different rates and extents) with other types of conductive metals such as, for example Al and W. It is further observed that the dielectric breakdown failure reliability related concern described above, is getting worse as integrated circuit critical dimensions continue to scale down.

In view of the above, there is a need for providing an interconnect structure in which the dielectric breakdown failure reliability related concern mentioned above is reduced or even completed eliminated.

SUMMARY OF THE INVENTION

The present invention provides an interconnect structure that has high leakage resistance and substantially no metallic residues present at the upper dielectric surface of a particular interconnect level of an interconnect structure. As such, the inventive interconnect structure exhibits an improved time-dependent-dielectric-breakdown (TDDB) as compared to prior art interconnect structures. The interconnect structure of the present invention includes a first dielectric cap that forms an interface with each conductive feature embedded within a dielectric material whose slope is opposite that of an electrical field that is generated by neighboring conductive features that are embedded within the dielectric material. As such, the electromigration of conductive material from the conductive features is avoided or substantially eliminated in the inventive interconnect structure. The interconnect structure of the invention thus has better reliability and technology extendibility than exiting semiconductor interconnect structures.

Specifically, and in broad terms, an interconnect structure is provided that comprises:

a dielectric material having a dielectric constant of 4.0 or less and comprising a plurality of conductive features embedded therein, said dielectric material having an upper surface that is located beneath an upper surface of each of said plurality of conductive features;

a first dielectric cap located on said upper surface of said dielectric material and extending onto at least a portion of said upper surface of each of said plurality of conductive features, said first dielectric cap forming an interface with each of said plurality of conductive features that is opposite to an electrical field that is generated by neighboring conductive features; and a second dielectric cap located on an exposed portion of said upper surface of each of said plurality of conductive features not covered with the first dielectric cap, said second dielectric cap further covering an exposed surface of said first dielectric cap.

In one embodiment of the present invention, the first dielectric cap is mushroom-shaped having a stem and cap, wherein the stem is located on the upper surface of the dielectric material and the cap is located on the stem. The cap portion of the first dielectric cap includes a portion that extends onto a surface portion of both sides of the conductive features next to the dielectric material. That is, the stem is located on the upper surface of the dielectric material and the cap is located on the stem and comprises a portion that extends onto the portion of each of the plurality of conductive features.

In another embodiment of the invention, the first dielectric cap is an oxide, while each of the plurality of conductive features comprises copper.

In addition to providing the above described interconnect structure, the present invention also provides a method of fabricating such an interconnect structure. In broad terms, the method of the present invention includes:

forming an initial structure including at least a dielectric material having a dielectric constant of 4.0 or less and comprising a plurality of conductive features embedded therein, said dielectric material having an upper surface that is located beneath an upper surface of each of the plurality of conductive features;

selectively depositing a first dielectric cap on said upper surface of said dielectric material and extending onto at least a portion of said upper surface of each of said plurality of conductive features, said first dielectric cap forming an interface with each of said plurality of conductive features that is opposite to an electrical field that is generated by neighboring conductive features; and forming a second dielectric cap on an exposed portion of said upper surface of each of said plurality of conductive features not covered with said first dielectric cap, said second dielectric cap further covering an exposed surface of said first dielectric cap.

In one embodiment of the present invention, the selective depositing comprises a selective oxidation deposition process and the first dielectric cap is mushroom-shaped having a stem and cap, wherein said stem is located on said upper surface of said dielectric material and said first dielectric cap is located on said stem and comprises a portion that extends onto both sides of the conductive features next to the dielectric material.

In this particular embodiment of the invention, the selective oxidation deposition process comprises chemical vapor deposition performed at a temperature from about 100° to about 450° C.

It is noted that the terms "conductive feature or plurality of conductive features" includes at least one conductive material such as, for example, Cu, that is embedded within the dielectric material. The conductive material forming the conductive feature is typically separated from the dielectric material by a diffusion barrier.

DETAILED DESCRIPTION OF THE INVENTION

The present invention, which provides an interconnect structure having high leakage resistance and substantially no metallic residues present at the surface of an interconnect dielectric material and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides an interconnect structure having high leakage resistance and substantially no metallic residues present at the surface of the dielectric material and a method of fabricating the same. The inventive interconnect structure exhibits improved TDDB than prior art invention structures.

Figure 2A:
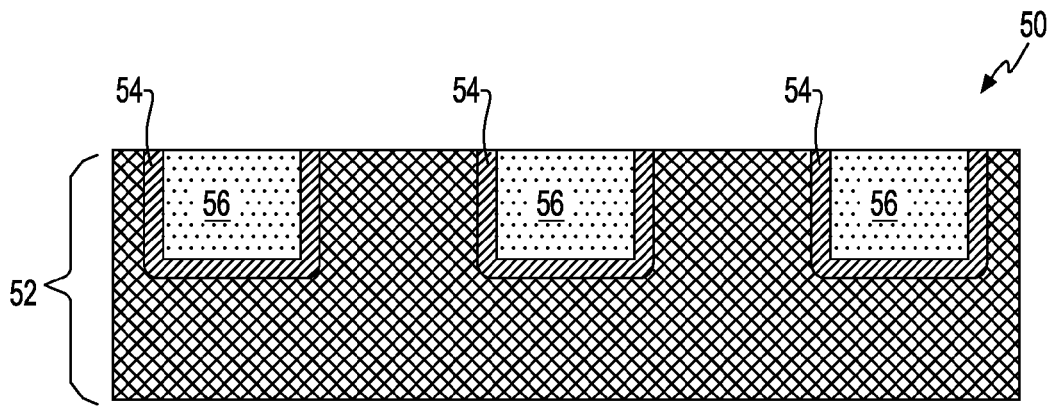
FIGS. 2A-2D are pictorial representations (through cross sectional views) depicting the basic processing steps that are employed in the present invention in fabricating a highly reliable and technology extendible interconnect structure having a high leakage resistance and substantially no metallic residues present at the surface of the dielectric material.

Reference is now made to FIGS. 2A-2D which illustrate the basic processing steps that are employed in forming the semiconductor interconnect structure of the present invention. FIG. 2A illustrates an initial structure 50 that comprises a dielectric material 52 and plurality of conductive features 56, each including a conductive material, embedded within the dielectric material 52. As shown, a diffusion barrier 54, in the shape of a "U", separates each of the conductive features 56 from the dielectric material 52. Also, as shown, the upper surfaces of the dielectric material 52, each conductive feature 56 and the diffusion barrier 54 are substantially coplanar with each other at this stage of the present invention.

The dielectric material 52 of the initial structure 50 may be located upon a substrate (not shown in the drawings of the present application). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a first interconnect level of a multilayered interconnect structure.

The dielectric material 52 of the initial structure 50 comprises any interlevel or intralevel dielectric including inorganic dielectrics or organic dielectrics. The dielectric material 52 may be porous or non-porous. Some examples of suitable dielectrics that can be used as the dielectric material 52 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 4.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric material 52 may vary depending upon the dielectric material used as well as the exact number of dielectrics layers within the dielectric material 52. Typically, and for normal interconnect structures, the dielectric material 52 has a thickness from about 50 to about 1000 nm.

The dielectric material 52 is deposited on the surface of the substrate (not shown) utilizing any conventional deposition process including, but not limited to chemical vapor deposition (CVD), plasma enhanced chemical vapor deposition (PECVD), spin-on coating, evaporation, and chemical solution deposition.

After forming the dielectric 52, a plurality of openings (which will subsequently house conductive features) are formed into the dielectric material 52 utilizing lithography and etching. The lithographic process includes forming a photoresist (not shown) atop the dielectric material 52, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), and/or a wet chemical etching process. Typically, reactive ion etching is used in providing the openings to the dielectric material 52.

The depth of each opening that is formed into the dielectric material 52 (measured from the upper surface of the dielectric material to the bottom wall of the opening) may vary and it is not critical to the present application. In some embodiments, each of the openings may extend entirely through the dielectric material. In yet other embodiments, each of the openings stops within the dielectric material 52 itself. In yet further embodiments, different depth openings can be formed.

It is further observed that each opening may be a via opening, a line opening, and/or a combined via/line opening. In FIG. 2A, and by way of an example, each of the openings is shown as line openings.

Next, a diffusion barrier 54 is formed on all exposed surfaces of the structure including atop the dielectric material 52 as well as within each of openings (i.e., on sidewalls and the bottom wall of each of the openings). The diffusion barrier 54 comprises Ta, TaN, Ti, TiN, Ru, RuN, RuTa, RuTaN, W, WN or any other material that can serve as a barrier to prevent a conductive material from diffusing there through. The thickness of the diffusion barrier 54 may vary depending on the deposition process used as well as the material employed. Typically, the diffusion barrier 54 has a thickness from about 2 to about 50 nm, with a thickness from about 5 to about 20 nm being more typical.

The diffusion barrier 54 is formed by a deposition process including, for example, chemical vapor deposition (CVG), plasma enhanced chemical vapor deposition (PECVD), atomic layer deposition (ALD), physical vapor deposition (PVD), sputtering, chemical solution deposition and plating.

Conductive features 56 including a conductive material are then formed within each of the openings that are now lined with at least diffusion barrier 54. The conductive material of each of the conductive features 56 may comprise polySi, SiGe, a conductive metal, an alloy comprising at least one conductive metal, a conductive metal silicide or combinations thereof. Preferably, the conductive material of each of the conductive features 56 is a conductive metal such as Cu, W or Al, with Cu or a Cu alloy (such as AlCu) being highly preferred in the present invention.

Any conventional deposition process including chemical vapor deposition (CVD), plasma enhanced chemical vapor deposition (PECVD), sputtering, chemical solution deposition or plating that fills the at least one opening from the bottom upwards can be used to provide each conductive feature 56 of the initial structure 50. Preferably, a bottom-up plating process is employed.

Next, a planarization process including, for example, chemical mechanical polishing and/or grinding is then performed to form the initial structure shown in FIG. 2A. Typically, chemical mechanical polishing is employed. It is noted that metallic residues (not shown) are typically present on the exposed surface of the dielectric material 52 at this point of the inventive process.

Figure 2B:
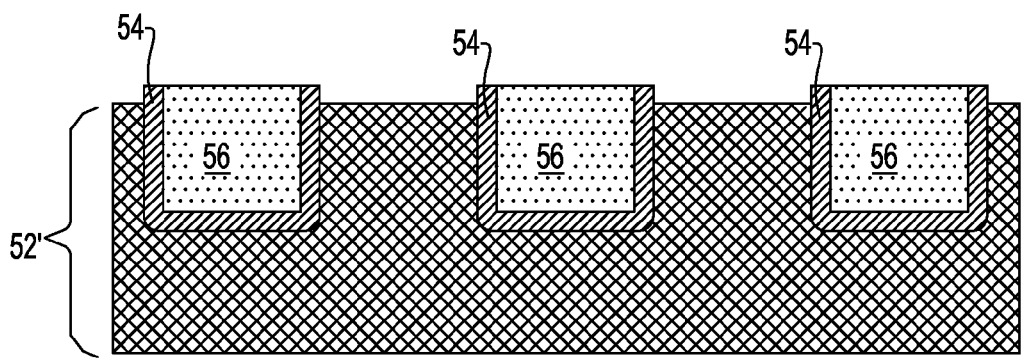

After providing the initial structure 50 shown in FIG. 2A, a dielectric recess process is performed which recesses (i.e., reduces a thickness of the dielectric material from a first thickness to a second thickness that is less than the first thickness) the dielectric material 52 to a level that is beneath the upper surface of both the diffusion barrier 54 and each of the conductive features 56. FIG. 2B illustrates the resultant structure that is formed after performing this dielectric recessing step. In FIG. 2B, reference numeral 52' denotes the recessed dielectric material, and 52r represents the recessed surface of the dielectric material. The distance of this recess measured from the top surface of each conductive feature 56 to the recessed surface 52r may vary depending on the exact recess process and conditions used. Typically, and by way of a non-limiting example, the distant of the recess is from about 1 to about 50 nm, with a distant from about 5 to about 30 nm being even more typical.

The dielectric recess process employed in the present invention in forming the structure shown in FIG. 2B includes any etching process (including dry etching and chemical wet etching) that selectively etches the dielectric material 52 relative to both the diffusion barrier 54 and the conductive material 56. Typically, the dielectric recess process employed in the present invention includes a chemical etching process or a reactive ion etching process. It is noted that this recess step substantially removes all metallic residues from the surface of the dielectric material.

Figure 1:
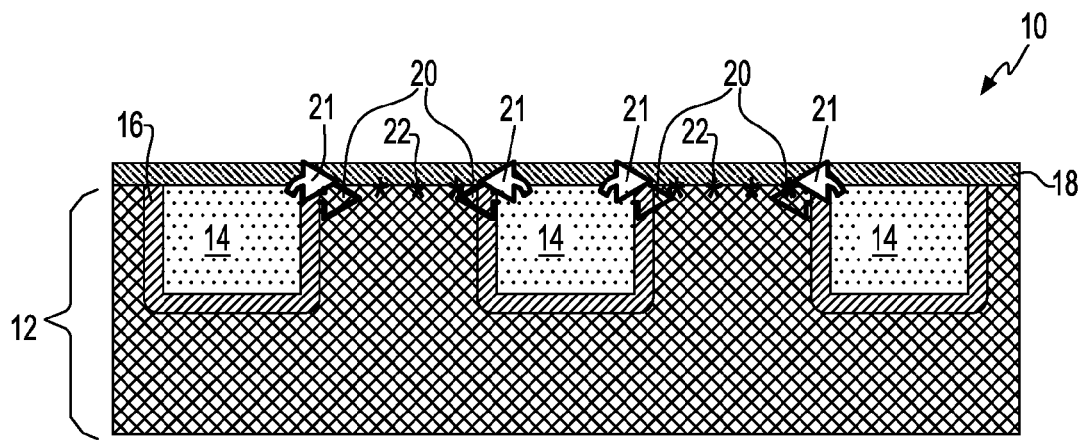
FIG. 1 is a pictorial representation (through a cross sectional views) depicting a prior art interconnect structure illustrating both Cu leakage and Cu residues.

At this point of the present invention, a selective deposition process is performed to form a first dielectric cap 58 having an interface 59 with each of the conductive features 56 whose slope is opposite to an electrical field that is produced (generated) by neighboring conductive features. The electric field is the same as that shown in FIG. 1. The resulted interface leads to a direction "into" the conductive features 56, which is opposite to the "outbound" direction. The resultant structure that is formed after performing the selective deposition process is shown, for example, in FIG. 2C. The first dielectric cap 58 may comprise an organic or inorganic dielectric, with an inorganic dielectric being highly preferred. Moreover, the first dielectric cap 58 may be porous or non-porous.

In particular, a first dielectric cap 58 in the shape of a mushroom is provided in which the stem 58A of the mushroom-shaped dielectric cap is located on and abutting the recessed dielectric surface 52' and the cap 58B of the mushroom-shaped first dielectric cap 58 is located on the stem and extends onto a surface of both the diffusion barrier 54 and each of the conductive features 56. Note that the cap 58B of the mushroom-shaped first dielectric cap 58 does not cover the entirety of the surface of each of the conductive features 56.

The first dielectric cap 58 formed in the present invention typically comprises an oxide, nitride and/or oxynitride. In a preferred embodiment, the first dielectric cap 58 is an oxide. The first dielectric cap 58 is formed utilizing a selective deposition such as, for example, an oxidation, nitridation and/or oxynitridation. Preferably, a selective oxidation deposition process is performed in forming the first dielectric cap 58 shown in FIG. 2C. When a selective oxidation deposition process is used in forming the first dielectric cap 58 shown in FIG. 2C any oxygen-containing ambient such as, for example, $O_2$, ozone, steam and air can be used. The selective oxidation deposition is typically performed by chemical vapor deposition at a deposition temperature from about 100° to about 450° C., with a deposition temperature of from about 200° to about 350° C. being even more typical.

When a selective nitridation deposition process is employed in forming a nitride dielectric cap, any nitrogen-containing ambient such as, for example, $N_2$ and $NH_3$ can be used. The selective nitridation deposition is typically performed by chemical vapor deposition at a deposition temperature from about 100° to about 450° C., with a deposition temperature of from about 200° to about 350° C. being even more typical.

When a selective oxynitridation deposition process is employed in forming an oxynitride dielectric cap, any ambient including an oxygen source and a nitrogen source can be used. The selective oxynitridation deposition is typically performed by chemical vapor deposition at a deposition temperature from about 100° to about 450° C., with a deposition temperature of from about 200° to about 350° C. being even more typical.

Figure 2C:
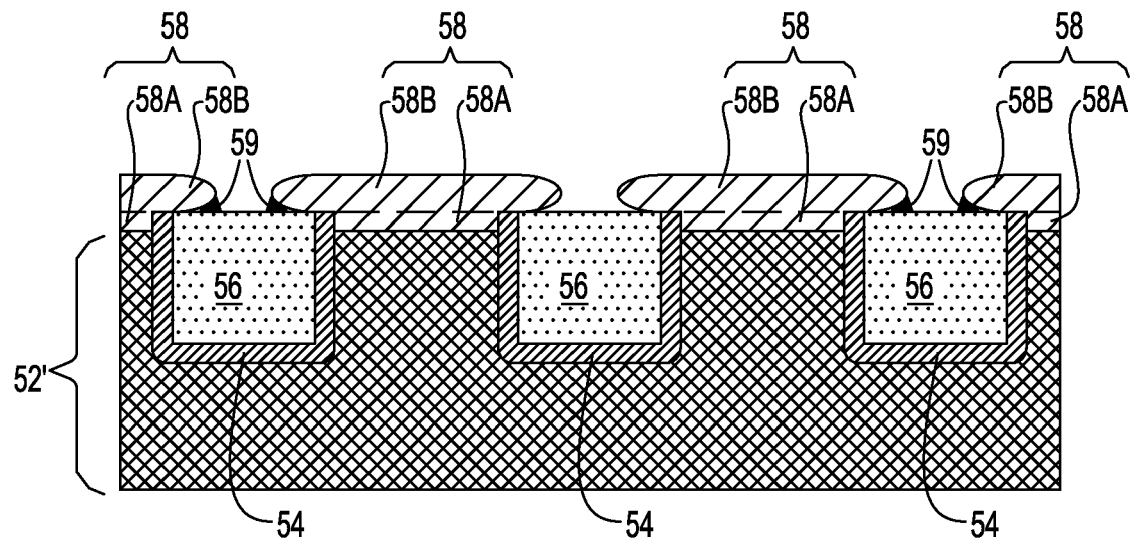
Figure 2D:
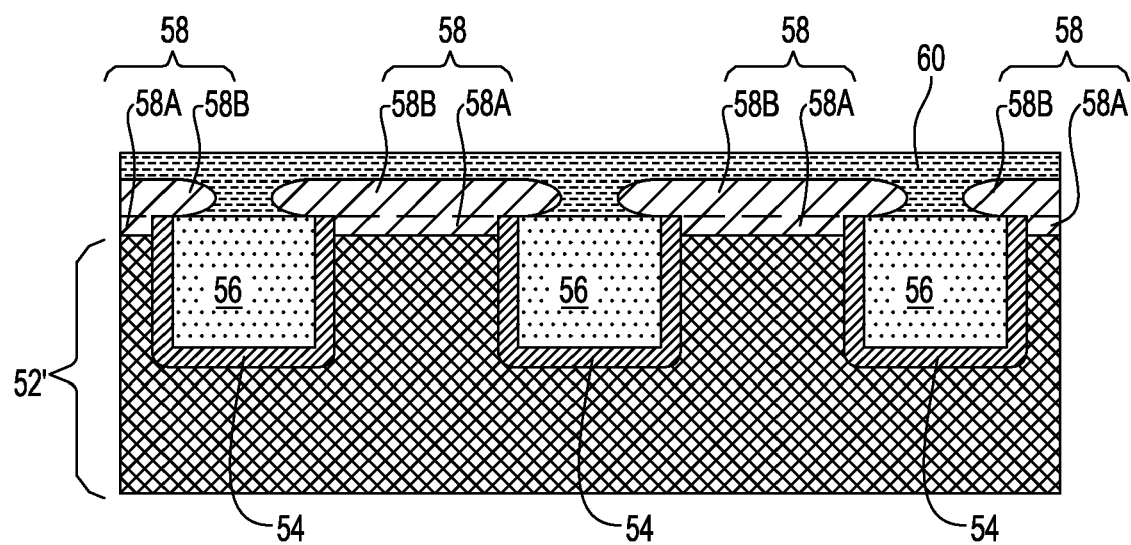

After forming the structure shown in FIG. 2C, a second dielectric cap 60 is formed providing the structure shown, for example, in FIG. 2D. Note that the second dielectric cap 60 is located on exposed portions of each of the conductive features 56 that are not covered with the first dielectric cap 58 as well as on the upper surface of the first dielectric cap 58. The second dielectric cap 60 includes any dielectric (organic or inorganic, porous or non-porous) capping layer whose dielectric constant is typically, but not necessarily always, less than 3.9, preferably, less than 3.2. Examples of suitable second dielectric capping layers that can be used in the present invention include, but are not limited to a carbon doped oxide, a nitrogen and hydrogen doped silicon carbide SiC(N,H) or multilayers thereof.

Any conventional deposition process such as, for example, chemical vapor deposition, plasma enhanced chemical vapor deposition, chemical solution deposition, evaporation, and atomic layer deposition may be used in forming the second dielectric cap 60. The thickness of the second dielectric cap 60 may vary depending on the technique used to form the same as well as the material make-up of the layer. Typically, the second dielectric cap 60 has a thickness from about 15 to about 100 nm, with a thickness from about 25 to about 45 nm being more typical.

It is noted that FIG. 2D illustrates the inventive structure that is formed by the inventive method described above. The inventive structure includes a dielectric material 52' having a dielectric constant of 4.0 or less and comprising at least one conductive material 56 embedded therein. The dielectric material 52' has an upper surface 52r that is located beneath an upper surface of each of conductive features 56. A first dielectric cap 58 is located on the upper surface of the dielectric material 52' and extends onto at least a portion of the upper surface of each of the conductive features 56. As shown, the first dielectric cap 58 forms an interface 59 (see, FIG. 2C) with each of said conductive features 56 that is opposite to an electrical field that is generated by neighboring conductive features 56. The inventive structure also includes a second dielectric cap 60 located on an exposed portion of the upper surface of each of said conductive features 56 not covered with the first dielectric cap 58. The second dielectric cap 60 further covers on an exposed surface of the first dielectric cap 58.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
a dielectric material having a dielectric constant of 4.0 or less and comprising a plurality of conductive features embedded therein, said dielectric material having an upper surface that is located beneath an upper surface of each of said plurality of conductive features;
a first dielectric cap located on said upper surface of said dielectric material and extending onto at least a portion of said upper surface of each of said plurality of conductive features, said first dielectric cap forming an interface with each of said plurality of conductive features that is opposite to an electrical field that is generated by neighboring conductive features; and
a second dielectric cap located on an exposed portion of said upper surface of each of said plurality of conductive features not covered with said first dielectric cap, said second dielectric cap further covering on an exposed surface of said first dielectric cap.

2. The interconnect structure of claim 1 wherein said first dielectric cap is mushroom-shaped having a stem and cap, wherein said stem is located on said upper surface of said dielectric material and said cap is located on said stem and comprises a portion that extends onto said portion of each of said plurality of conductive features.

3. The interconnect structure of claim 1 wherein said first dielectric cap is an oxide.

4. The interconnect structure of claim 1 wherein each of said plurality of conductive features comprises copper and is separated from said dielectric material by a U-shaped diffusion barrier.

5. A method of fabricating an interconnect structure comprising:

forming an initial structure including at least a dielectric material having a dielectric constant of 4.0 or less and comprising a plurality of conductive features embedded therein, said dielectric material having an upper surface that is located beneath an upper surface of each of the plurality of conductive features;

selectively depositing a first dielectric cap on said upper surface of said dielectric material and extending onto at least a portion of said upper surface of each of said plurality of conductive features, said first dielectric cap forming an interface with each of said plurality of conductive features that is opposite to an electrical field that is generated by neighboring conductive features; and forming a second dielectric cap on an exposed portion of said upper surface of each of said plurality of conductive features not covered with the first dielectric cap, said second dielectric cap further covering on an exposed surface of said first dielectric cap.

6. The method of claim 5 wherein said selective depositing comprises a selective oxidation deposition process and said first dielectric cap is mushroom-shaped having a stem and cap, wherein said stem is located on said upper surface of said dielectric material and said cap is located on said stem and comprises a portion that extends onto said portion of each of said plurality of conductive features.

7. The method of claim 6 wherein said selective oxidation deposition process comprises chemical vapor deposition performed at a temperature from about 100° to about 450° C.

* * * * *